(12) United States Patent
Kim et al.

(10) Patent No.: US 7,318,997 B2
(45) Date of Patent: Jan. 15, 2008

(54) EXPOSURE APPARATUS AND METHOD FOR FORMING FINE PATTERNS OF SEMICONDUCTOR DEVICE USING THE SAME

(75) Inventors: Hyung-Won Kim, Chungchenogbuk-do (KR); Seung-Won Baek, Ichon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 521 days.

(21) Appl. No.: 10/951,828

(22) Filed: Sep. 27, 2004

(65) Prior Publication Data
US 2005/0074703 A1    Apr. 7, 2005

(30) Foreign Application Priority Data
Oct. 2, 2003    (KR) .................. 10-2003-0068850

(51) Int. Cl.
*G03F 7/038* (2006.01)
*H01L 21/02* (2006.01)

(52) U.S. Cl. ...................... 430/322; 430/397

(58) Field of Classification Search .......... 430/322, 430/397
See application file for complete search history.

(56) References Cited

U.S. PATENT DOCUMENTS

| | | | | |
|---|---|---|---|---|
| 5,258,266 | A * | 11/1993 | Tokui et al. | 430/326 |
| 6,245,491 | B1 | 6/2001 | Shi | |
| 6,686,132 | B2 * | 2/2004 | Cheng et al. | 430/325 |
| 2002/0046703 | A1 * | 4/2002 | Templeton | 118/500 |

* cited by examiner

*Primary Examiner*—Mark F. Huff
*Assistant Examiner*—Caleen O. Sullivan
(74) *Attorney, Agent, or Firm*—Andrew D. Fortney

(57) ABSTRACT

Disclosed are an exposure apparatus for forming fine patterns of a semiconductor using an electric field and a method for forming fine patterns using the exposure apparatus. The exposure apparatus comprises an electric field generator for generating an electric field to be applied to infiltrate an acid ($H^+$) produced when a photoresist film is exposed into non-exposure regions. Non-exposure regions into which an acid is infiltrated along with exposure regions in a development process can be removed by applying an electric field to the acid produced during exposure of a photoresist film such that the acid is infiltrated into the non-exposure regions.

14 Claims, 3 Drawing Sheets

EXPOSURE APPARATUS AND METHOD FOR FORMING FINE PATTERNS OF SEMICONDUCTOR DEVICE USING THE SAME

CLAIM OF PRIORITY

This application makes reference to, incorporates the same herein, and claims all benefits accruing under 35 U.S.C. §119 from an application for APPARATUS FOR FORMING FINE PATTERNS OF SEMICONDUCTOR WAFER BY ELECTRIC FIELD AND THE METHOD OF THE SAME filed in the Korean Industrial Property Office on Oct. 2, 2003 and there duly assigned Serial No. 10-2003-0068850.

BACKGROUND OF THE INVENTION (a) Field of the Invention

The present invention discloses an exposure apparatus and a method for forming fine patterns of a semiconductor device using the same, and more particularly to an exposure apparatus for forming fine patterns of a semiconductor device using an electric field and a method for forming fine patterns of a semiconductor device using the same.

(b) Description of the Related Art

In the art of semiconductor device, a lithography technology for transcribing patterns is one of the most essential technologies for micro-circuit processes and is classified into a photolithography using light, an electron beam lithography using electron beams, and X-ray lithography using X-rays.

The photolithography technology uses ultraviolet rays as an exposure source and requires a photomask to transmit light selectively for pattern transcription.

In addition, when patterns of a semiconductor device are formed using the photolithography technology, various kinds of RETs (Resolution Enhancement Technique) are used to form fine patterns in the semiconductor device. Of these RETs, a modified illumination system and a phase inversion mask are most commonly being used.

However, recently, patterning of micro-scopic structured devices by the above-mentioned RETs reaches the critical point.

SUMMARY OF THE INVENTION

In consideration of the above problem, it is an aspect of the present invention to an exposure apparatus for forming fine patterns using an electric field.

It is another aspect of the present invention to provide a method for forming fine patterns of a semiconductor device using the exposure apparatus.

The aspect of the present invention is achieved by an exposure apparatus comprising an electric field generator for generating an electric field to be applied to infiltrate an acid ($H^+$) produced when a photoresist is exposed into non-exposure regions.

Another aspect of the present invention is achieved by an exposure method for removing non-exposure regions into which an acid is infiltrated along with exposure regions in a development process by applying an electric field to the acid produced during exposure of a photoresist such that the acid is infiltrated into the non-exposure regions.

More specifically, another aspect of the present invention is achieved by a method for forming fine patterns of a semiconductor device, comprising:
forming a photoresist film on a wafer;
exposing the photoresist film by irradiating a mask on which patterns are formed;
infiltrating an acid generated in exposure regions of the photoresist film into non-exposure regions by applying an electric field to the acid; and removing the exposure regions and the non-exposure regions into which the acid is infiltrated by developing the exposure regions and the non-exposure regions.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENT

An exposure apparatus and a method for forming fine patterns using the same according to a preferred embodiment of the present invention will now be described in detail with reference to FIGS. 1 to 4.

Figure 1:
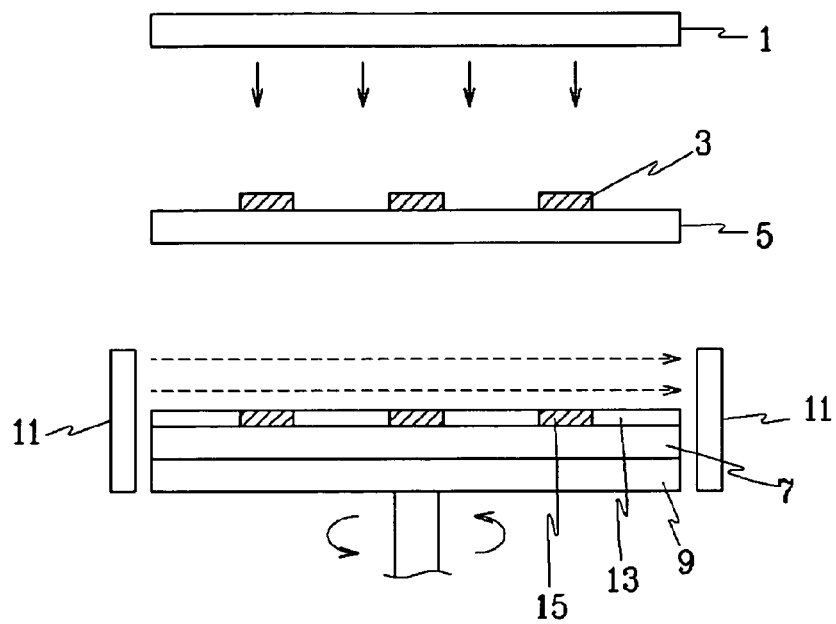
FIG. 1 is a schematic side view illustrating an exposure apparatus according to an embodiment of the present invention.

Referring to FIG. 1, the exposure apparatus of the present invention comprises a light source 1, a mask 5 having light-shield patterns for selectively transmitting light emitted from the light source 1, a stock 9 for stocking a wafer 7, and a pair of electrodes 11 for applying an electric field.

With the exposure apparatus as constructed above, the mask 5 comprises a transparent substrate, for example, a substrate made from material though which ultraviolet rays are penetrated or a quartz substrate. In addition, light-shield patterns 3 for shielding light irradiated on the wafer 7 are formed on the surface of the mask 5.

In addition, a photoresist film 13 and a layer (not shown) on which patterns will be formed later are sequentially formed on the surface of the wafer 7.

Accordingly, when light from the light source 1 is irradiated on the photoresist film 13 through the mask 5, exposure regions of the photoresist 13 are exposed and non-exposure regions 15 having the same pattern as the light-shield patterns 3 of the mask 5 are formed on the photoresist film 13.

The pair of electrodes 11 is properly disposed around the stock 9 and produces an electric field with fixed intensity when a power is supplied. This electric field infiltrates an acid ($H^+$) generated in the photoresist film of the exposure regions into the non-exposure regions 15, as will be described later.

Next, a method for forming fine patterns on the wafer using the exposure apparatus as constructed above will be described.

Figure 2:
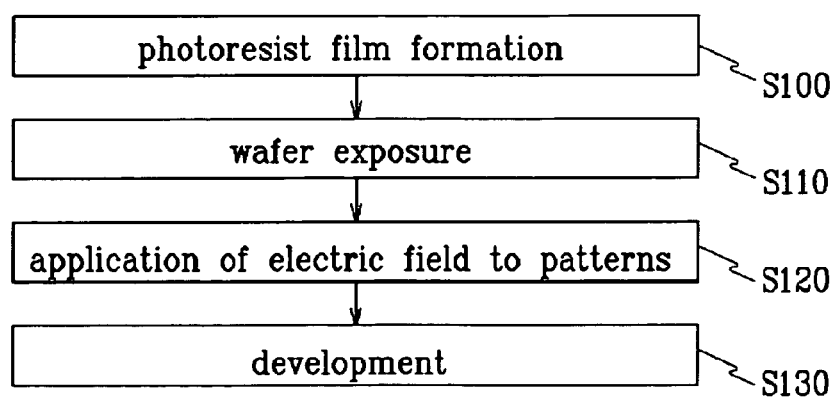
FIG. 2 is a process block diagram illustrating a method for forming fine patterns using the exposure apparatus of FIG. 1.
Figure 3:
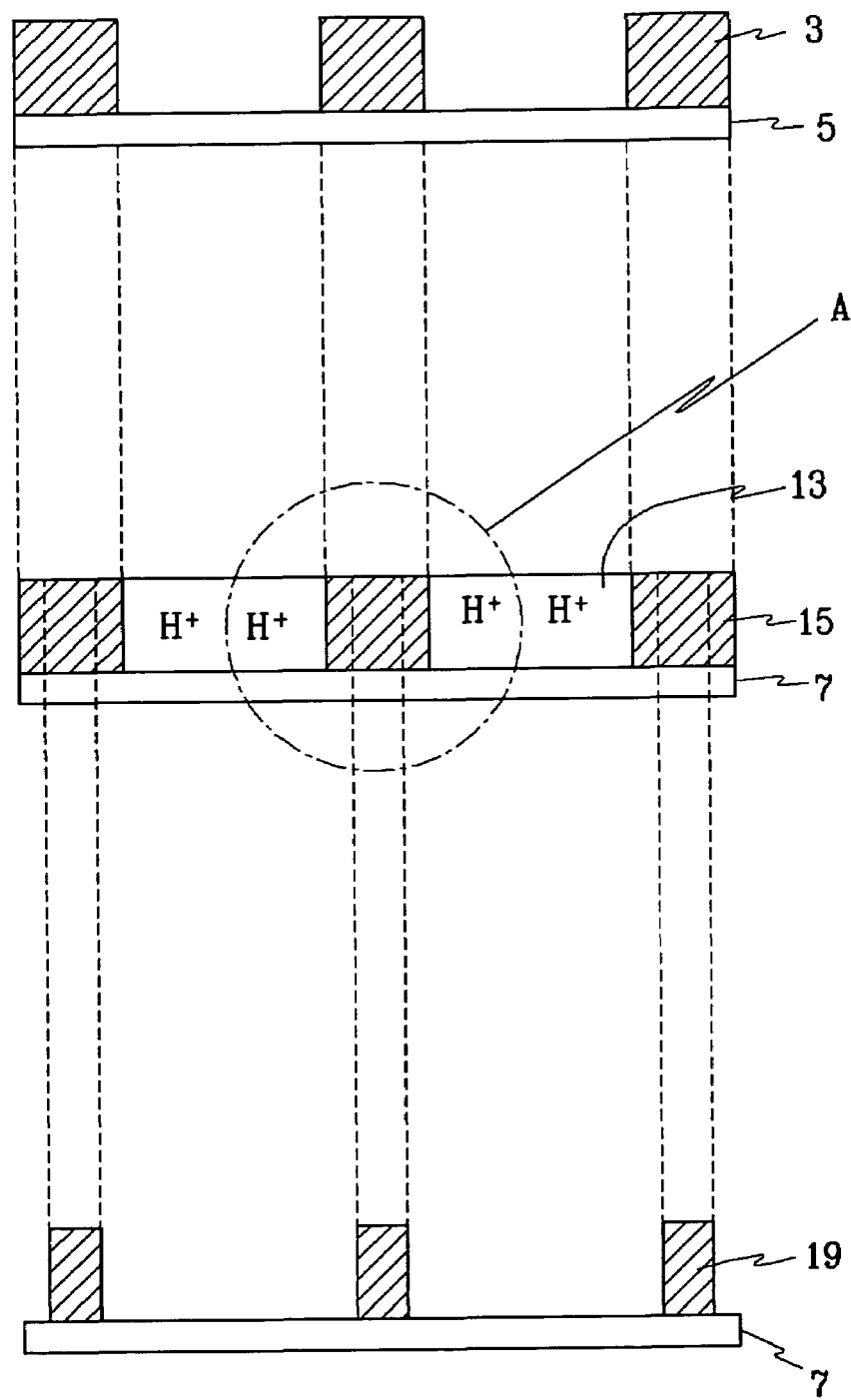
FIG. 3 is a view used to compare a state where a photoresist film on a wafer is exposed with a state where the photoresist film on the wafer is developed.

Referring to FIGS. 2 and 3, the method for forming fine patterns according to the embodiment of the present invention comprises a step S100 of forming the photoresist film 13 by applying a photoresist agent for deep ultraviolet (DUV) on the surface of the wafer 7, a step S110 of exposing the photoresist film 13 of the wafer 7 by actuating the light source 1 after disposing the mask above the wafer 7, a step S120 of generating an electric field around the wafer 7, and a step S130 of developing the wafer 7 after performing a post expose bake (PEB) process on the wafer 7.

In the fine pattern forming method comprising the above-mentioned steps, the surface of the wafer 7 is subject to a surface treatment for increasing surface viscosity and the photoresist agent is applied thereon in the step S100 for forming the photoresist film on the wafer 7. Next, after forming the photoresist film 13, a soft baking process for heating the wafer 7 at a constant temperature is performed to remove solvents contained in viscous fluids and the photoresist agent, and the photoresist film 13 is activated in a condition adaptable to exposure.

After the photoresist film forming step S100, the wafer exposure step S10 is performed.

In the wafer exposure step S110, the mask 5 is aligned above the wafer 7, and the non-exposure regions 15 having the same pattern as the patterns 3 of the mask 5 are formed on the photoresist film 13 by irradiating light from the light source 1 on the mask 7. At this time, a quantity of acid ($H^+$) is produced in the exposure regions.

At this time, when the pair of electrodes 11 is actuated to generate an electric field, the quantity of acid ($H^+$) is effectively infiltrated into the non-exposure regions 15 by an electric force generated by the electric field.

In the fine pattern forming step S120, a power is supplied to the air of electrodes 11 disposed properly around the wafer 7 such that the electric field is generated between the pair of electrodes 11. Then, the electric field generates the electric force, which acts on the acid produced in the exposure regions. Accordingly, as shown in FIG. 4, the acid produced in the exposure regions is effectively infiltrated into side portions of the non-exposure regions 15 by the electric force.

In addition, if the electric field is varied by varying the polarity of the electrodes 11 periodically, the acid is more effectively infiltrated into the whole side portions of the non-exposure regions 15.

Figure 4:
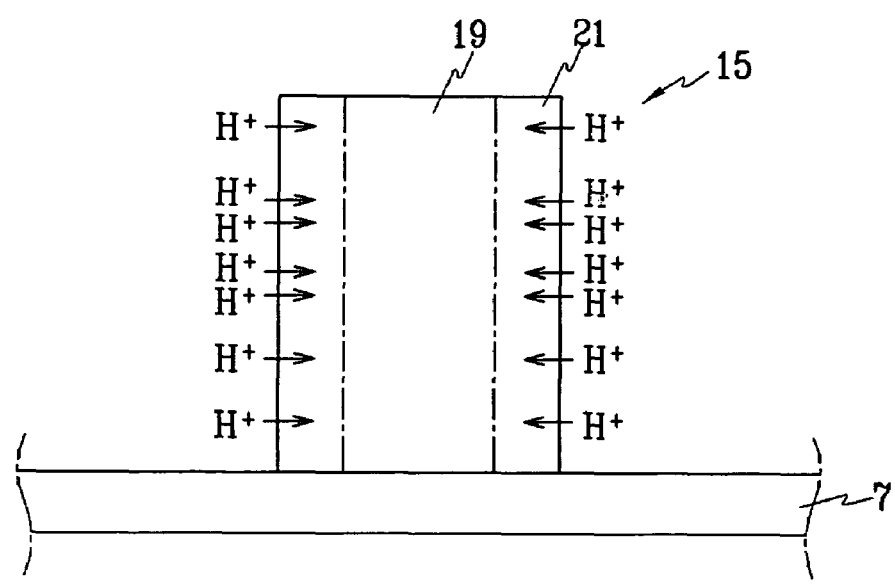
FIG. 4 is an enlarged partial view of "A" portion of FIG. 3.

In FIG. 4, reference numeral 21 denotes a region into which the acid is infiltrated, which is referred to as "acid infiltration region" hereinafter.

The acid infiltration region 21 contains the acid, as described above. Typically, the acid plays a catalytic role in changing a resin to a structure where the resin is aptly dissolved in a developing agent.

Accordingly, the acid infiltration region 21 can be removed by the developing agent.

On the other hand, when the electric field is generated around the wafer 7, as described above, the acid infiltration region 21 can be formed with a uniform width by rotating the stock 11.

The acid infiltration region 21 formed according to the method as described above reacts with the developing agent in the developing step S130 for removing the exposure regions. Accordingly, photoresist films in the exposure regions and the acid infiltration region 21 are removed together by the developing agent. Also, the non-exposure regions remaining after the photoresist films in the exposure regions and the acid infiltration region are removed by the developing agent are formed with fine patterns with their width reduced by a width of the acid infiltration region, as shown in FIG. 3.

As is apparent from the above description, according to the present invention, by infiltrating the acid produced in the exposure regions of the photoresist film into the side portion of the non-exposure regions and removing the acid infiltration region using the developing agent in the exposure process, the fine patterns with their width reduced by a width of the acid infiltration region can be formed.

Although the preferred embodiment of the present invention has been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method for forming fine patterns of a semiconductor device in a development process, comprising:
   applying an electric field, while rotating a wafer, laterally across a horizontal surface of an exposed photoresist film on the wafer to infiltrate acid into non-exposure regions of the photoresist and form an acid-infiltrated non exposure region to a width sufficient to reduce a width of a subsequently developed pattern: and
   removing the acid-infiltrated non-exposure region along with exposure regions.

2. The method of claim 1, further comprising forming the photoresist film by applying a photoresist agent for deep ultraviolet (DUV) to the wafer.

3. The method of claim 1, wherein the electric field comprises changing the electric field periodically.

4. A method for forming fine patterns of a semiconductor device, comprising:
   forming a photoresist film on a wafer;
   exposing the photoresist film by irradiating a mask on which patterns are formed;
   infiltrating an acid generated in exposure regions of the photoresist film into non-exposure regions by applying an electric field to the acid laterally across a horizontal surface of the wafer while rotating the wafer, and forming a non-exposure region into which the acid is infiltrated to a width sufficient to reduce a width of a subsequently developed pattern; and
   removing the exposure regions and the non-exposure regions into which the acid is infiltrated by developing the exposure regions and the non-exposure regions.

5. The method of claim 4, wherein the photoresist film is formed by applying a photoresist agent for deep ultraviolet (DCV) to the wafer.

6. The method of claim 4, wherein applying the electric field comprises changing the electric field periodically.

7. The method of claim 4, wherein the non-exposure region into which acid is infiltrated has a uniform width.

8. The method of claim 4, wherein the developed regions have a width less than a width of respective light shield patterns.

9. The method of claim 4, wherein removing the non-exposure region into which acid is infiltrated comprises developing the photoresist.

10. The method of claim 4, further comprising applying the electric field to the wafer after the photoresist film on the wafer is exposed and before removing the non-exposure regions into which acid is infiltrated along with exposure regions.

11. The method of claim 1, wherein the acid-infiltrated non-exposure region has a uniform width.

12. The method of claim 1, wherein the developed regions have a width less than a width of respective light shield patterns.

13. The method of claim 1, wherein removing the acid-infiltrated non-exposure region comprises developing the photoresist.

14. The method of claim 1, further comprising applying the electric field to the wafer after the photoresist film on the wafer is exposed and before removing the acid-infiltrated non-exposure regions along with exposure regions.

* * * * *